US008026605B2

(12) United States Patent
Dordi et al.

(10) Patent No.: US 8,026,605 B2
(45) Date of Patent: Sep. 27, 2011

(54) INTERCONNECT STRUCTURE AND METHOD OF MANUFACTURING A DAMASCENE STRUCTURE

(75) Inventors: Yezdi Dordi, Palo Alto, CA (US); John M. Boyd, Hillsboro, OR (US); Fritz C. Redeker, Fremont, CA (US); William Thie, Mountain View, CA (US); Tiruchirapalli Arunagiri, Fremont, CA (US); Hyungsuk Alexander Yoon, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 190 days.

(21) Appl. No.: 11/638,413

(22) Filed: Dec. 14, 2006

(65) Prior Publication Data
US 2008/0142971 A1 Jun. 19, 2008

(51) Int. Cl.
*H01L 23/535* (2006.01)
*H01L 21/4763* (2006.01)

(52) U.S. Cl. . 257/751; 257/752; 257/753; 257/E23.141; 257/E23.155; 257/E23.161; 257/E21.584; 438/643

(58) Field of Classification Search ............... 257/499, 257/751, 752, 753, E23.141, E23.155, E23.161, 257/E21.584; 438/643
See application file for complete search history.

(56) References Cited

U.S. PATENT DOCUMENTS

| | | | |
|---|---|---|---|
| 5,313,089 A * | 5/1994 | Jones, Jr. ................ | 257/295 |
| 5,893,752 A * | 4/1999 | Zhang et al. ............. | 438/687 |
| 5,972,722 A * | 10/1999 | Visokay et al. ............ | 438/3 |
| 6,358,810 B1 * | 3/2002 | Dornfest et al. .......... | 438/396 |
| 6,365,502 B1 | 4/2002 | Paranjpe et al. | |
| 6,441,492 B1 | 8/2002 | Cunningham | |
| 6,608,383 B2 * | 8/2003 | Yokoyama et al. ........ | 257/761 |
| 6,713,373 B1 * | 3/2004 | Omstead .................. | 438/608 |
| 6,916,398 B2 | 7/2005 | Chen et al. | |
| 7,060,605 B2 | 6/2006 | Uglow et al. | |
| 7,129,171 B2 | 10/2006 | Zhu et al. | |
| 7,135,098 B2 | 11/2006 | Hymes | |
| 2002/0004293 A1 | 1/2002 | Soininen et al. | |

(Continued)

FOREIGN PATENT DOCUMENTS

WO 2006/121604 A2 11/2006

OTHER PUBLICATIONS

Yezdi Dordi et al., "Processes and Systems for Engineering a Barrier Surface for Copper Deposition", U.S. Appl. No. 11/514,038, filed Aug. 30, 2006 (Unpublished U.S. Patent Application).

(Continued)

*Primary Examiner* — Ngan Ngo
*Assistant Examiner* — Benjamin Tzu-Hung Liu
(74) *Attorney, Agent, or Firm* — Buchanan Ingersoll & Rooney PC (57) ABSTRACT

An interconnect structure is provided, including a layer of dielectric material having at least one opening and a first barrier layer on sidewalls defining the opening. A ruthenium-containing second barrier layer overlays the first barrier layer, the second barrier layer having a ruthenium zone, a ruthenium oxide zone, and a ruthenium-rich zone. The ruthenium zone is interposed between the first barrier layer and the ruthenium oxide zone. The ruthenium oxide zone is interposed between the ruthenium zone and the ruthenium-rich zone.

18 Claims, 5 Drawing Sheets

U.S. PATENT DOCUMENTS

| | | |
|---|---|---|
| 2002/0019123 A1* | 2/2002 | Ma et al. .................. 438/622 |
| 2003/0096468 A1 | 5/2003 | Soininen et al. |
| 2003/0124262 A1 | 7/2003 | Chen et al. |
| 2004/0005753 A1 | 1/2004 | Kostamo et al. |
| 2004/0241321 A1 | 12/2004 | Ganguli et al. |
| 2005/0095443 A1 | 5/2005 | Kim et al. |
| 2005/0098440 A1 | 5/2005 | Kailasam et al. |
| 2005/0181598 A1* | 8/2005 | Kailasam .................. 438/654 |
| 2005/0206000 A1 | 9/2005 | Aggarwal et al. |
| 2005/0208754 A1 | 9/2005 | Kostamo et al. |
| 2005/0274621 A1 | 12/2005 | Sun et al. |
| 2005/0274622 A1 | 12/2005 | Sun et al. |
| 2006/0033678 A1 | 2/2006 | Lubomirsky et al. |
| 2006/0102895 A1 | 5/2006 | Hendrix et al. |
| 2006/0162658 A1 | 7/2006 | Weidman |
| 2006/0165892 A1 | 7/2006 | Weidman |
| 2006/0240187 A1 | 10/2006 | Weidman |
| 2006/0246217 A1 | 11/2006 | Weidman et al. |
| 2006/0246699 A1 | 11/2006 | Weidman et al. |
| 2006/0251872 A1 | 11/2006 | Wang et al. |
| 2006/0252252 A1 | 11/2006 | Zhu et al. |
| 2007/0048447 A1 | 3/2007 | Lee et al. |
| 2007/0264436 A1 | 11/2007 | Dordi et al. |
| 2007/0292603 A1 | 12/2007 | Dordi et al. |
| 2008/0142972 A1 | 6/2008 | Redeker et al. |
| 2008/0146025 A1 | 6/2008 | Dordi et al. |
| 2008/0150138 A1 | 6/2008 | Bright et al. |
| 2008/0152823 A1 | 6/2008 | Boyd et al. |
| 2008/0260940 A1 | 10/2008 | Yoon et al. |
| 2008/0296166 A1 | 12/2008 | Woods et al. |
| 2008/0299772 A1 | 12/2008 | Yoon et al. |
| 2008/0315422 A1 | 12/2008 | Boyd et al. |
| 2009/0134520 A1 | 5/2009 | Bright et al. |
| 2009/0320749 A1 | 12/2009 | Yoon et al. |

OTHER PUBLICATIONS

Yang, C.-C. et al., "Physical, Electrical and Reliability Characterization of Ru for Cu Interconnects", IEEE Interconnect Technology Conference, 2006 International. Posted online: Jul. 5, 2006, ISBN 1-4244-0104-6, pp. 187-190 (Abstract Only).

International Search Report and Written Opinion dated Mar. 14, 2008 for PCT/US2007/024859.

* cited by examiner

INTERCONNECT STRUCTURE AND METHOD OF MANUFACTURING A DAMASCENE STRUCTURE

BACKGROUND

Semiconductor devices, such as transistors, are commonly formed on the surface of a single crystal silicon wafer and can include multiple levels of patterned and interconnected layers. After the fabrication of the active devices has been completed, they are wired into a desired circuit configuration by forming multiple layers of interconnect lines, contacts, vias and dielectric layers.

SUMMARY

In an embodiment, an interconnect structure is provided. A layer of dielectric material has at least one opening and a first barrier layer on sidewalls defining the opening. A ruthenium- and oxygen-containing second barrier layer overlays the first barrier layer, the second barrier layer having a ruthenium zone, a ruthenium oxide zone, and a ruthenium-rich zone. The ruthenium zone is interposed between the first barrier layer and the ruthenium oxide zone. The ruthenium oxide zone is interposed between the ruthenium zone and the ruthenium-rich zone.

In an embodiment, an interconnect structure is provided. A layer of dielectric material has at least one opening and a tantalum- and nitrogen-containing first barrier layer on sidewalls defining the opening. The first barrier layer has a tantalum-rich zone and a tantalum nitride zone, the nitrogen content of the tantalum nitride zone being greater than the nitrogen content of the tantalum-rich zone. The tantalum nitride zone is interposed between the dielectric material and the tantalum-rich zone. A ruthenium- and oxygen-containing second barrier layer overlays the first barrier layer, the second barrier layer having a ruthenium zone, a ruthenium oxide zone, and a ruthenium-rich zone. The ruthenium zone is interposed between the tantalum-rich zone and the ruthenium oxide zone. The ruthenium oxide zone is interposed between the ruthenium zone and the ruthenium-rich zone.

A method of manufacturing a damascene structure is provided. In an embodiment, at least one opening is formed in a dielectric material. Sidewalls defining the opening are coated with a tantalum- and nitrogen-containing first barrier layer. The first barrier layer is treated to form a tantalum-rich zone and a tantalum nitride zone. The nitrogen content of the tantalum nitride zone is greater than the nitrogen content of the tantalum-rich zone. The tantalum nitride zone is interposed between the dielectric material and the tantalum-rich zone. The first barrier layer is coated with a ruthenium-containing second barrier layer. The second barrier layer is treated to form a ruthenium oxide zone and a ruthenium zone, the ruthenium zone interposed between the tantalum-rich zone and the ruthenium oxide zone. The ruthenium oxide zone is treated to form a ruthenium-rich zone, the ruthenium oxide zone interposed between the ruthenium zone and ruthenium-rich zone.

DETAILED DESCRIPTION

As the dimensions of microelectronic devices continue to decrease, the time delay for the propagation of a signal between multiple transistors (propagation delay) has become an increasingly important parameter in determining device performance. Propagation delay is proportional to the product of the resistance of a metal interconnect line (R) and the capacitance of the interlevel dielectric insulation material (C) (also referred to as RC delay). Thus, to minimize propagation delay, it is beneficial to incorporate an insulating material with a low dielectric constant material in combination with a high conductivity metal (or low resistivity metal). Copper (Cu) has gained considerable interest as a metal for interconnect lines, as an alternative to the more conventional aluminum (Al) interconnect metal (R=3.0-5.0 $\mu\Omega$-cm), because of its lower resistivity value (R<2 $\mu\Omega$-cm). Likewise, other dielectric materials, such as organosilicate glass (OSG), organosilicate glass (OSG), tetraethylorthosilicate (TEOS), fluorinated silica glass (FSG) and carbon-doped oxides, are also gaining interest as alternatives to silicon oxide ($k\approx 4.0$).

However, prior to the successful implementation of copper as an interconnect material, several obstacles must be overcome. First, because copper does not readily form volatile by-products, conventional or subtractive etching techniques are inadequate. Thus, damascene manufacturing processes are necessary to form patterned copper interconnect lines, which involve depositing conductive material in previously patterned openings (e.g., trenches, contacts, or vias). Second, because copper diffuses readily in silicon and many dielectric materials surrounding metal interconnects, short circuiting or degradation of electrical properties can occur. Thus, any damascene process involving copper includes the formation of a diffusion barrier layer to encapsulate the copper interconnect lines.

Figure 1:
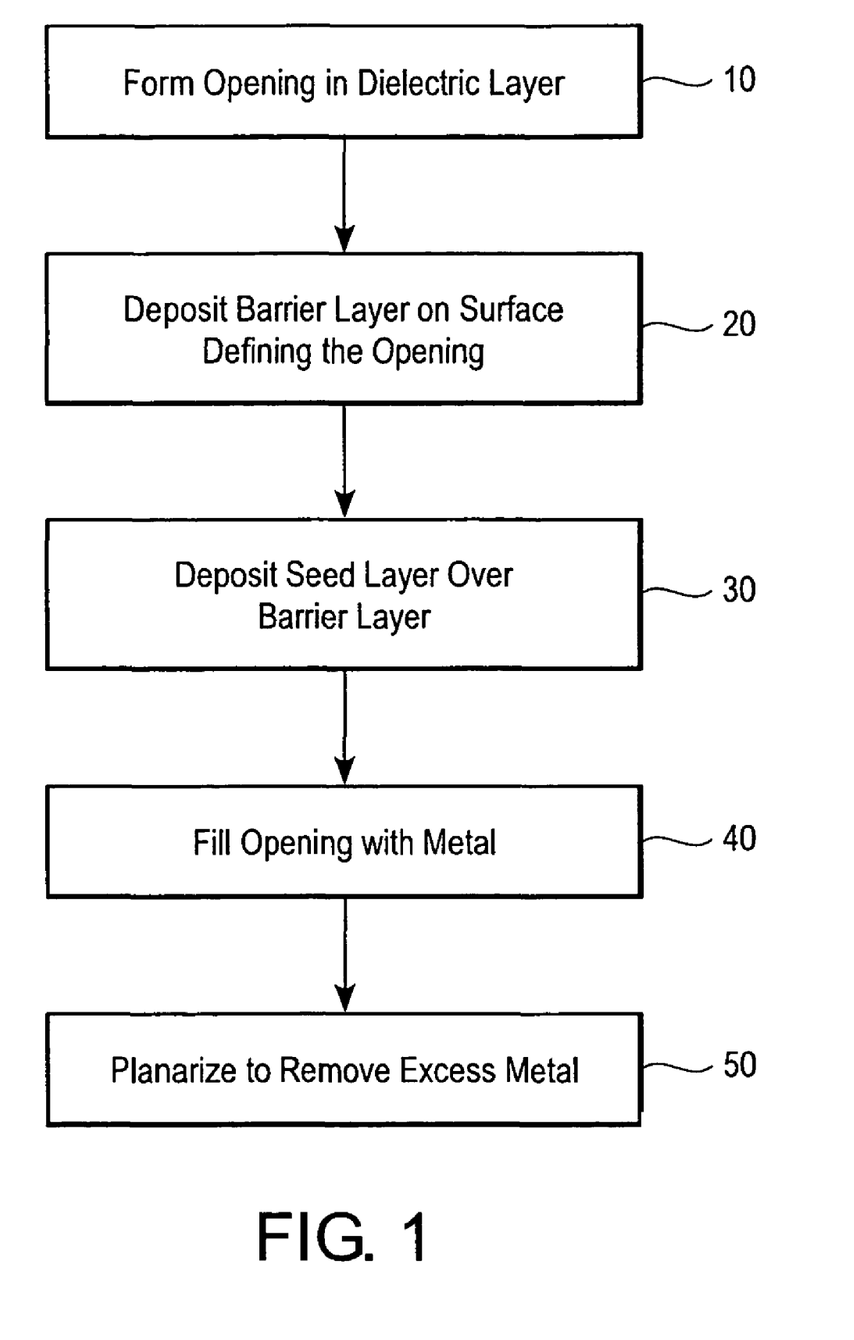
FIG. 1 is a flow chart illustrating an exemplary embodiment of a method of making a damascene structure.

FIG. 1 is an exemplary embodiment of a damascene manufacturing process. In step 10, an opening is formed in a dielectric layer. This is typically performed by patterning openings in a mask layer, such as photoresist, on a dielectric layer in the shape of a trench, contact, or via, followed by wet or dry etching. Preferably, the dielectric material is a low-k dielectric (k<3.0), such as k less than 2.5, less than 2.0, or less than 1.5. In step 20, a barrier material is deposited to form a layer on at least the sidewalls defining the opening in the dielectric layer. One or more barrier layers can be formed to protect the dielectric material adjacent to the copper interconnects from being poisoned by copper atoms diffusing from the copper interconnect into the adjacent dielectric material. For example, the diffusion of copper atoms into the dielectric layer(s) can either cause short circuiting or undesirable increase in the dielectric constant.

After the deposition of at least one barrier layer, in step 30, a seed layer is deposited over the barrier material to line the inner walls of the opening (e.g., trench, contact, or via). For example, for a copper interconnect material, a copper seed layer is beneficial in promoting good adhesion and establishing good electrical contact between the interconnect lines. A copper seed layer can be formed by any suitable deposition technique, such as chemical vapor deposition (CVD) or the like. In step 40, the opening is filled with a bulk metal. For a copper interconnect structure, an electroless or electroplated copper process can be used for gapfill.

In step 50, the structure is planarized to remove the excess portion of the conductive material by any suitable technique such as chemical mechanical planarization (CMP) or an etch-back process.

The damascene manufacturing process can either be a single or double (dual) damascene process. For the latter process, either the via-first approach or the trench-first approach can be used.

Ideally, the diffusion barrier material can prevent the migration of copper atoms into the surrounding dielectric material, as well as have a low solubility with copper, without forming any intermetallic compounds. Exemplary barrier materials include tantalum (Ta), tantalum nitride (TaN), ruthenium (Ru), ruthenium oxide ($RuO_x$) and alloys thereof. Other candidate materials for diffusion barriers can also include chromium (Cr), molybdenum (Mo), tungsten (W), and rhenium (Re). For example, the barrier material can be coated by physical vapor deposition (PVD), atomic layer deposition (ALD), or the like.

Physical vapor deposition (PVD) is a coating technique characterized by the evaporation of atoms or molecules from a source under low pressure. The atoms or molecules can either be produced by evaporation from a source or directing energetic gaseous ions at a source (or target) to sputter the atoms or molecules. These atoms or molecules impinge and condense on the surface of a substrate to form a thin film. If PVD is performed in the presence of a reactive gas, a compound is deposited on the substrate (e.g., deposition of Ta in a nitrogen atmosphere forms TaN). This deposition technique offers the ability to conformally and uniformly coat openings with lower aspect ratios (less than 2).

As the dimensions of transistor devices continue to shrink, the aspect ratios of openings, such as trenches, contacts, or vias, for interconnect lines continue to increase (e.g., greater than 2). When PVD is used to coat openings with a higher aspect ratio, difficulties may arise in achieving a uniform coating thickness. Thus, one of the remaining challenges in depositing barrier layers in high aspect ratio openings is the ability to coat a conformal barrier layer in such openings.

Atomic layer deposition (ALD) is an emerging technology that offers the ability to conformally coat openings with higher aspect ratios (greater than 2). ALD is a self-limiting coating technique in which reactants are introduced into a deposition chamber, a single precursor at a time, to react and form a thin film. A first precursor is pulsed into the chamber, saturating the surface of the substrate, followed by the removal of any excess precursor through the introduction of a purging gas. A second precursor is then pulsed into the chamber, reacting with the first precursor, forming a single monolayer of the thin film. The excess second precursor and any reaction products are removed, through the introduction of a purging gas. The process can be repeated a desired number of times until a desired film thickness is achieved.

Although tantalum, tantalum nitride, ruthenium, and ruthenium oxide are excellent barrier materials, if the surface of the barrier layer is not properly controlled to prevent oxidation before and during deposition of the seed layer, the structure may delaminate, regardless of the deposition technique used. For example, tantalum is susceptible to the formation of tantalum oxide. Although copper adheres well to tantalum, copper layers often delaminate if formed over tantalum oxide, resulting in degradation of the interconnect. Once formed, tantalum oxide is difficult to reduce to its metallic state. Thus, it is highly desirable that throughout the deposition process, the exposure to an oxygen ambient be carefully controlled.

Additionally, barrier layers of different materials may be incompatible with copper as a seed layer, due to poor adhesion characteristics. For example, tantalum nitride and ruthenium oxide tend to function poorly as adhesion layers for the overlying deposition of copper. In the case of tantalum nitride, an overlying tantalum layer, which adheres to both tantalum nitride and copper must applied. Likewise, in the case of ruthenium oxide, an overlying ruthenium layer, which adheres to both ruthenium oxide and copper can be formed over the ruthenium oxide layer.

Figure 2:
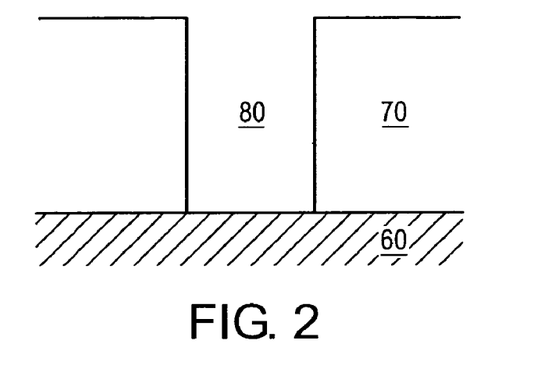
FIGS. 2-10 are cross-sectional views of an exemplary embodiment of a method of manufacturing a damascene structure, including an opening formed in a dielectric material and including coating and treating steps.

FIG. 2 is an exemplary embodiment of an interconnect structure in which dielectric layer 70 is deposited on a substrate 60. For example, dielectric layer 70 can be deposited by CVD or using a spin-on technique. Substrate 60 can be a single crystal silicon wafer. Preferably, dielectric layer 70 is a low-k dielectric (k<3.0), such as k less than 2.5, less than 2.0, or less than 1.5. Examples of suitable low-k dielectric materials include $SiO_2$/siloxane derivatives such as F- and C-doped organosilicate glass (OSG) oxides, such as FLOW-FILL® (manufactured by Trikon), BLACK DIAMOND® (manufactured by Applied Materials), CORAL® (manufactured by Novellus), AURORA® (manufactured by ASMI), organic polymers, such as JSR® (manufactured by JSR) and SiLK® (manufactured by Dow Chemical), or mesoporous glass, engineered with porogens to enhance the low-k characteristics. Higher dielectric constant materials (k=3.8-4.0) can also be used for contact layers, including borophosphosilicate glass (BPSG) and tetraethylorthosilicate (TEOS). A masking layer, such as a photoresist layer (not shown), can be deposited and patterned over dielectric layer 70, followed by etching to form opening 80. In an exemplary embodiment, opening 80 can either be a via, a contact, or a trench.

Figure 3:
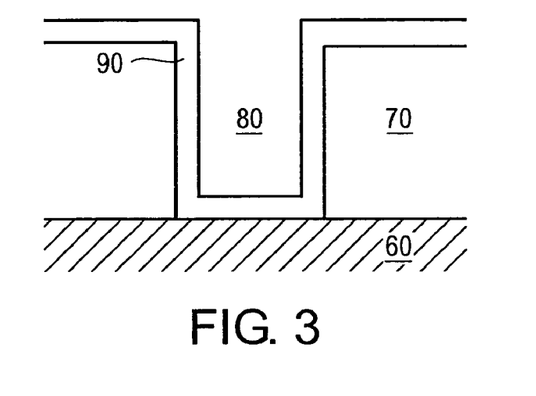

As seen in FIG. 3, a first barrier layer 90 is deposited on at least the sidewall surfaces of the opening 80 in dielectric 70. If the opening 80 has a relatively higher aspect ratio (i.e., greater than 2), first barrier layer 90 is preferably deposited using the ALD technique. By depositing one monolayer of first barrier layer material 90 at a time, ALD offers the ability to deposit nearly perfect conformal films. For copper interconnects, exemplary suitable barrier materials include tantalum (Ta), tantalum nitride (TaN) or any combination thereof. In one embodiment, TaN is initially deposited by ALD as first barrier layer 90 at a thickness between about 20 Å and 40 Å.

For depositing tantalum nitride by ALD, tantalum precursors are pulsed into a reaction chamber, which is maintained at a pressure of about 100 mTorr to about 3 Torr. The substrate is heated to a temperature of about 150° C. to about 300° C. The pulse time can range from about 100 milliseconds to about 3 seconds, such that at least the sidewall surfaces of opening 80 are saturated with a monolayer of tantalum precursor. The reaction chamber is purged with argon gas, for example, followed by the introduction of a nitrogen-containing gas, with a similar pulse time as for the tantalum precursor. The tantalum precursor and the nitrogen-containing gas react to form an atomically-thin, conformal layer of tantalum nitride. Excess gases and reaction products are removed when the reaction chamber is purged with an inert gas (e.g., argon). The cycle can be repeated until the appropriate thickness of tantalum nitride is achieved. ALD deposition techniques can include thermal ALD, plasma enhanced ALD, or hot filament ALD. Plasma enhanced ALD can include both direct and remote plasmas.

Examples of tantalum precursors can include pentakis(ethylmethylamino)tantalum (PEMAT), pentakis(diethylamino) tantalum (PDEAT), pentakis(dimethylamino)tantalum (PDMAT), t-butylimino tris(diethylamino)tantalum (TBTDET), t-butylimino tri-(ethylmethylamino)tantalum (TBTEMT), tantalum halides (i.e., tantalum pentafluoride, tantalum pentachloride, tantalum pentabromide) and derivatives thereof. Examples of nitrogen-containing gases can include ammonia or N,N-dimethylhydrazine.

Figure 4:
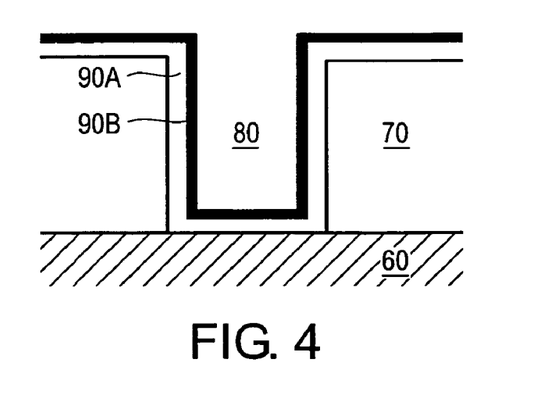

As shown in FIG. 4, tantalum- and nitrogen-containing first barrier layer 90 is subjected to hydrogen reduction to create a tantalum-rich zone 90B (i.e., $Ta_xN_y$ with x>y) and a tantalum nitride zone 90A. As illustrated in FIG. 4, tantalum-rich zone 90B overlays tantalum nitride zone 90A, the tantalum nitride zone 90A being interposed between the dielectric material 70 and the tantalum-rich zone 90B. The nitrogen content of the tantalum nitride zone 90A is greater than the nitrogen content of the tantalum-rich zone 90B. The tantalum-rich zone 90B improves the adhesion of first barrier layer 90 to any overlying metals, such as ruthenium or copper, for example. Hydrogen reduction can either be performed by thermal reduction or by exposure to a hydrogen-containing plasma, described below.

In an exemplary embodiment, the tantalum- and nitrogen-containing first barrier layer 90 can be plasma treated such as in an inductively coupled or remote source (downstream) plasma apparatus to form a tantalum-rich zone in the tantalum nitride (such as tantalum-rich zone 90A). Process gases for the plasma treatment can include hydrogen ($H_2$), ammonia ($NH_3$), and an inert carrier gas, such as argon (Ar) or helium (He), with a total gas flow rate from about 100 sccm to about 500 sccm. The flow rate of the hydrogen can range from about 100 sccm to about 200 sccm. The flow rate of ammonia can be up to about 100 sccm. The flow rate of the inert gas can be up to about 500 sccm. The chamber pressure can be in the range from about 5 mTorr to about 50 mTorr, with a wafer temperature in the range from about 10° C. to about 200° C. The treatment time can range from about 15 seconds to about 150 seconds, preferably about 75 seconds. To generate the plasma, a radio-frequency (RF) power between about 200 W to about 2,000 W can be applied at a frequency of about 2 MHz to about 27.3 MHz.

For hydrogen or hydrogen/helium plasmas generated in an inductively coupled plasma apparatus, a RF bias power can be applied to the wafer by a bottom electrode, up to about 100 W, at an RF frequency of 400 kHz to about 27.3 MHz. For a 200 mm diameter wafer, up to 50 W bias power can be applied. However, when applying a RF bias power, heavier inert gases, such as argon, should be excluded from the process gases, because sputtering effects could damage thinner tantalum nitride layers.

In an alternative embodiment, the tantalum nitride can be treated in a capacitively coupled parallel-plate plasma apparatus. Process gases can include hydrogen ($H_2$), ammonia ($NH_3$), and helium (He) with a total gas flow ranging from about 100 sccm to about 1,000 sccm. The chamber pressure can range from about 100 mTorr to about 500 mTorr, with a wafer temperature ranging from about 10° C. to about 200° C. To generate the plasma, an RF power between about 100 W to about 1,000 W can be applied at a frequency of about 13.56 MHz to about 60 MHz. An RF bias power, up to about 200 W, and at a frequency between about 400 kHz to about 2 MHz can be applied. However, when applying a RF bias power, heavier inert gases, such as argon, should be excluded from the process gases, because sputtering effects could damage thinner tantalum nitride layers.

In another embodiment, the tantalum nitride can be treated in a downstream or remote plasma processing apparatus. For such treatments, process gases include hydrogen ($H_2$), ammonia ($NH_3$), helium (He), and argon (Ar) with a total gas flow from about 100 sccm to about 2000 sccm. The process pressure can range from about 0.5 Torr to about 2 Torr, with a process temperature ranging from about 20° C. to about 200° C. An RF power between about 500 W to about 2,500 W can be applied at a frequency of about 400 kHz to about 2.56 MHz. Due to the remote plasma source, thinner tantalum nitride layers will not be sputtered by heavier elements, such as argon.

Once the tantalum-rich zone 90B has been created within barrier layer 90, an overlying layer is immediately deposited to prevent the formation of tantalum oxide. To prevent formation of tantalum oxide, the tantalum-rich zone 90B is preferably kept in a controlled atmosphere (i.e. a low oxygen environment, such as a vacuum atmosphere) prior to depositing any overlying film.

Figure 5:
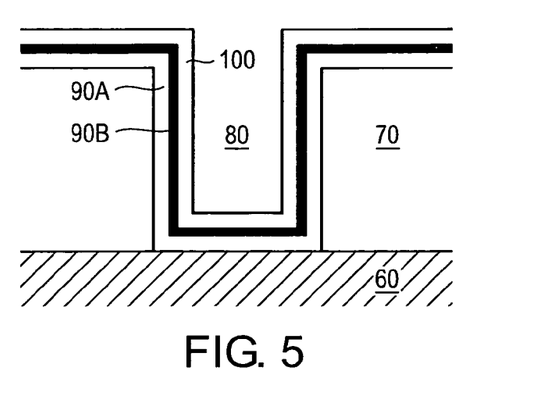

As illustrated in FIG. 5, second barrier layer 100 can be deposited over first barrier layer 90 to further enhance the barrier properties. For example, second barrier layer 100 can be an oxygen diffusion reducing material, such as ruthenium. If the opening 80 has a relatively high aspect ratio (e.g., greater than 2), second barrier layer 100 is preferably deposited using the ALD technique. In one embodiment, ruthenium is initially deposited by ALD as second barrier layer 100 at a thickness between about 20 Å to about 40 Å.

For depositing ruthenium by ALD, ruthenium precursors are pulsed into a reaction chamber, which is maintained at a pressure of about 100 mTorr to about 3 Torr. The substrate is heated to a temperature of about 150° C. to about 300° C. The pulse time can range from about 100 milliseconds to about 3 seconds, such that the substrate surface is saturated with a monolayer of ruthenium precursor. The reaction chamber is purged with an inert gas (e.g., argon), followed by the introduction of hydrogen ($H_2$) gas, with a similar pulse time as used for the ruthenium precursor. The ruthenium precursor and the hydrogen gas reacts to form an atomically-thin, conformal layer of ruthenium. Excess gases and reaction products are removed when the reaction chamber is purged with an inert gas (e.g., argon). The cycle can be repeated until the appropriate ruthenium thickness is achieved. ALD deposition techniques can include thermal ALD, plasma enhanced ALD, or hot filament ALD. Plasma enhanced ALD can include both direct and remote plasmas. Alternatively, ammonia ($NH_3$) can be used as a hydrogen source to react with the ruthenium precursor.

Examples of ruthenium precursors include bis(cyclopentadienyl)ruthenium ($RuCp_2$), bis(ethylcyclopentadienyl)ruthenium ($Ru(CpEt)_2$) or derivatives thereof.

As described above, ruthenium oxide is a poor catalytic surface for any subsequent electroless copper plating. However, ruthenium oxide can provide enhanced diffusion barrier properties to copper migration, in comparison to ruthenium. This barrier effect is due to the reduction in copper diffusion along the grain boundaries in ruthenium oxide. Thus, one approach is the formation of a $Ru/RuO_x/Ru$ composite as second barrier layer 100. This composite second barrier layer 100 offers: (i) protection of the underlying Ta or TaN layer from oxidation; (ii) improved barrier properties of ruthenium oxide; and (iii) the appropriate catalytic surface for subsequent electroless copper plating.

Figure 6:
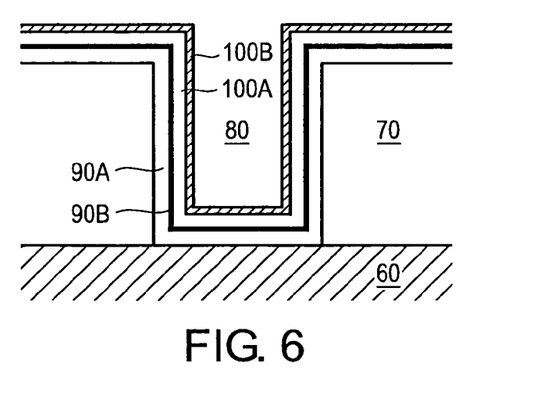

Ruthenium-containing second barrier layer 100 is subjected to oxidation to create a ruthenium oxide zone 100B and ruthenium zone 100A. As illustrated in FIG. 6, ruthenium oxide 100B overlays ruthenium zone 100A, the ruthenium zone 100A being interposed between the first barrier layer 90 and ruthenium oxide zone 100B. For example, the thickness of ruthenium oxide zone 100B can range from about 10 Å to about 15 Å. The ruthenium oxide zone 100B improves diffusion barrier properties to copper migrating, as described above.

In an exemplary embodiment, oxidation techniques include plasma treatment with oxygen ($O_2$), carbon monoxide (CO), or carbon dioxide ($CO_2$) process gases, either individually or in combination. Optionally, one or more dilution gases, such as helium or argon may be added to the process gas. The plasma processing can be performed in an inductively coupled plasma apparatus, capacitively coupled plasma apparatus, a downstream plasma apparatus, or the like.

Figure 7:
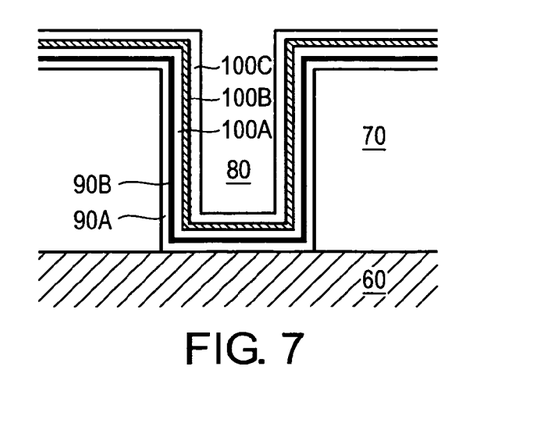

Referring to FIG. 7, ruthenium oxide zone 100B is next subjected to hydrogen reduction to create ruthenium-rich zone 100C. As a results of the hydrogen reduction, the oxygen content of the ruthenium oxide zone 100B is greater than the oxygen content of the ruthenium-rich zone 100C. In one embodiment, ruthenium-rich zone 100C can be ruthenium metal. As shown, ruthenium-rich zone 100C overlays ruthenium oxide zone 1008, the ruthenium oxide zone 100B interposed between ruthenium zone 100A and ruthenium-rich zone 100C. For example, the thickness of ruthenium-rich zone 100C can be about a monolayer in thickness. In another embodiment, the thickness of ruthenium-rich zone 100C can range from about 5 Å to about 10 Å. The ruthenium-rich zone 100C provides the appropriate catalytic surface for subsequent electroless copper plating, as described above.

Hydrogen reduction of ruthenium oxide can either be performed by thermal reduction or by exposure to a hydrogen-containing plasma, similar to the methods described above for reducing tantalum nitride. In an exemplary embodiment, hydrogen reduction techniques include plasma treatment with hydrogen ($H_2$), ammonia ($NH_3$), helium (He), or argon (Ar) process gases, either individually or in combination. The plasma processing can be performed in an inductively coupled plasma apparatus, capacitively coupled plasma apparatus, a downstream plasma apparatus, or the like.

Figure 8:
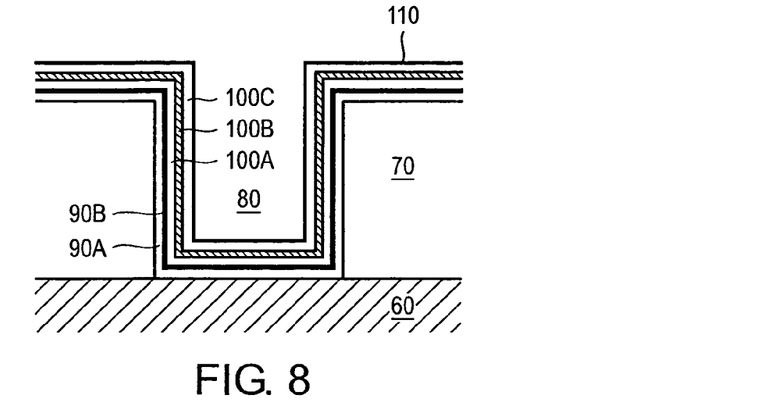
Figure 9:
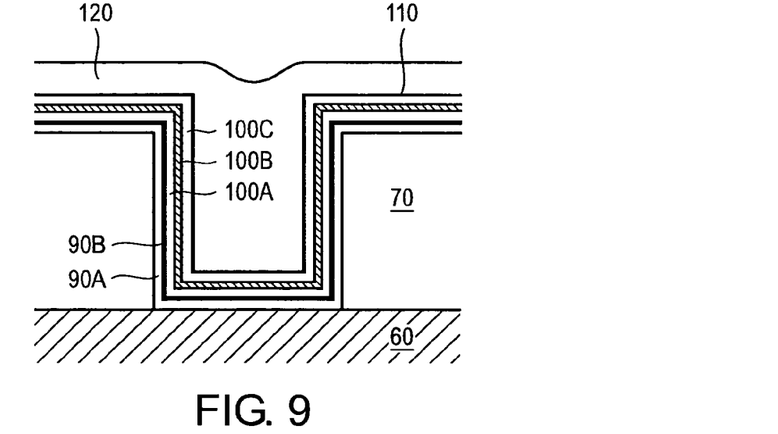

As illustrated in FIG. 8, a copper seed layer 110 is deposited over ruthenium-rich zone 100C. For example, copper seed layer 110 can be deposited using PVD or electroless plating techniques. Following the deposition of copper seed layer 110, the opening 80 is filled with a bulk metal 120 to form the interconnect structure, as illustrated in FIG. 9. For example, opening can be filled with copper bulk metal 120, using copper electroless or electroplating process. The details for the electroless copper plating process are described in commonly-assigned U.S. patent application Ser. No. 11/461,415, entitled "System and Method for Forming Patterned Copper Lines Through Electroless Copper Plating," the entire content of which is hereby incorporated by reference.

Figure 10:
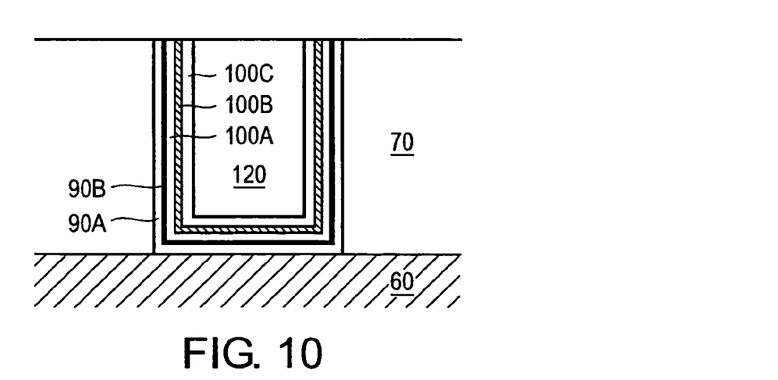

As illustrated in FIG. 10, any excess bulk metal 120 can be removed by planarization techniques, such as chemical mechanical polishing (CMP) or etch-back.

As described above, control over interfacial properties, including control over oxidation, allows the formation of a high-quality interface. One approach for controlling interface quality is reducing the exposure of as-deposited or as-treated layers to an oxygen-containing ambient. One approach is performing all process steps (e.g., ALD, plasma treatment) within an atmospherically-controlled modular process tool to minimize oxygen exposure. This modular process tool is also described in commonly-assigned U.S. patent application Ser. No. 11/461,415 and commonly-assigned U.S. patent application Ser. No. 11/514,038, entitled "Process and System for Engineering a Barrier Surface for Copper Deposition," the entire content of which is hereby incorporated by reference.

Figure 11:
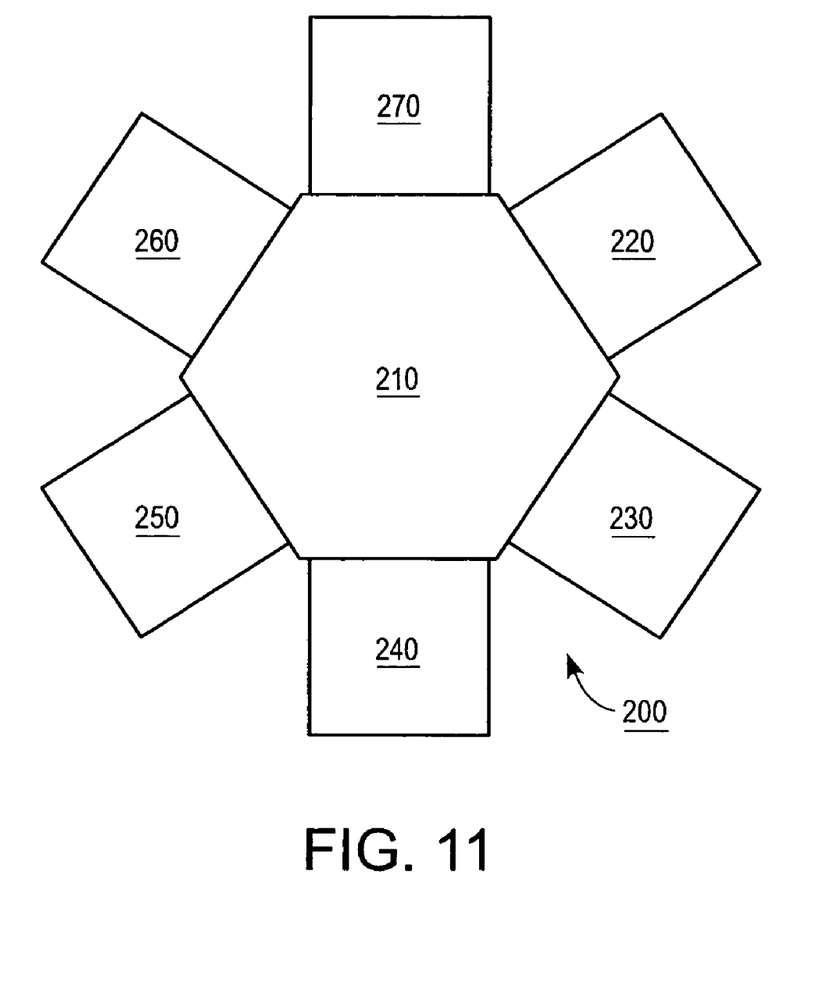
FIG. 11 is a simplified schematic view of a modular process tool with a controlled atmosphere.

FIG. 11 illustrates a simplified schematic of modular process tool 200 with transfer chamber 210 connected to processing chambers 220-270. Transfer chamber 210 has a controlled atmosphere and can either be maintained at a low-pressure or filled with an inert gas (e.g., helium, nitrogen or argon). Transfer chamber 210 can also be equipped with robotics to transfer wafers between each of the processing chambers 220-270. In an exemplary configuration, processing chambers 220-270 can be: (i) an ALD reactor 220 for the deposition of tantalum nitride; (ii) hydrogen reduction chamber 230 (i.e, thermal reduction chamber or hydrogen-containing plasma processing apparatus); (iii) an ALD reactor 240 for the deposition of ruthenium; (iv) oxidation chamber 250 (i.e., oxygen-containing plasma processing apparatus); (v) a copper seed layer deposition chamber 260 (i.e., PVD) and/or (vi) electroless copper plating system 270. By implementing the process steps illustrated in FIGS. 2-9 in situ using modular process tool 200, oxidation of as-deposited or as-treated metals can be minimized. Thus, all coating and treating is performed while maintaining the semiconductor substrate in a vacuum environment.

As described above, the oxidation of a tantalum-containing barrier layer can be detrimental due to poor adhesion of overlying metals. Moreover, tantalum oxide is difficult to reduce to its metallic state. For example, after forming tantalum- and nitrogen-containing first barrier layer 90 in an ALD reactor 220, the wafer can be transferred to a separate chamber for hydrogen reduction using the robotics system in transfer chamber 210. Likewise, after tantalum- and nitrogen-containing first barrier layer 90 is subjected to hydrogen reduction to create a tantalum-rich zone 90B in hydrogen reduction chamber 230, the wafer can be transferred to ALD reactor 240 for the deposition of an overlying ruthenium barrier layer 100. Because the substrate is transferred through transfer chamber 210, under a controlled atmosphere (e.g., low-oxygen content) oxidation of tantalum- and nitrogen-containing first barrier layer 90 and tantalum-rich zone 90B can be minimized.

While the invention has been described in detail with reference to specific embodiments thereof, it will be apparent to those skilled in the art that various changes and modifications can be made, and equivalents employed, without departing from the scope of the appended claims.

What is claimed is:

1. An interconnect structure comprising:
   a layer of dielectric material having at least one opening;
   a first barrier layer on sidewalls defining the opening;
   a ruthenium- and oxygen-containing second barrier layer overlaying the first barrier layer, the second barrier layer having a ruthenium zone which consists of ruthenium, a ruthenium oxide zone, and a ruthenium-rich zone, the ruthenium zone being interposed between the first barrier layer and the ruthenium oxide zone, and the ruthenium oxide zone being interposed between the ruthenium zone and the ruthenium-rich zone; and
   a seed layer over the second barrier layer and a bulk metal filling the entire opening, wherein the seed layer and bulk metal are composed of copper or a copper alloy.

2. The interconnect structure of claim 1, wherein:
   the ruthenium-rich zone consists of ruthenium;
   (ii) the opening is a trench, contact or via;
   (iii) the dielectric material is a low-k dielectric or a higher-k dielectric;
   (iv) the structure is a dual damascene structure or a contact structure; and/or
   (v) the material of the first barrier layer is chromium, molybdenum, tungsten, tantalum, or rhenium.

3. A method of manufacturing the interconnect structure of claim 1, comprising:
   forming at least one opening in a dielectric material;

coating sidewalls defining the opening with a tantalum- and nitrogen-containing first barrier layer;

treating the first barrier layer to form a tantalum-rich zone and a tantalum nitride zone, wherein the nitrogen content of the tantalum nitride zone is greater than the nitrogen content of the tantalum-rich zone, the tantalum nitride zone being interposed between the dielectric material and the tantalum-rich zone;

coating the first barrier layer with a ruthenium-containing second barrier layer;

treating the second barrier layer to form a ruthenium oxide zone and a ruthenium zone consisting of ruthenium, the ruthenium zone interposed between the tantalum-rich zone and the ruthenium oxide zone;

treating the ruthenium oxide zone to form a ruthenium-rich zone, the ruthenium oxide zone interposed between the ruthenium zone and ruthenium-rich zone; and coating a copper seed layer over the second barrier layer, filling the opening with copper, and planarizing a top surface of the dielectric material.

4. The method of claim 3, wherein the sidewalls of the first barrier layer are coated by atomic layer deposition (ALD), thermal ALD, plasma enhanced ALD, or hot filament ALD.

5. The method of claim 4, wherein the ALD is performed with a tantalum precursor selected from the group consisting of pentakis (ethylmethylamino) tantalum (PEMAT), pentakis (diethylamino) tantalum (PDEAT), pentakis (dimethylamino) tantalum (PDMAT), t-butylimino tris(diethylamino) tantalum (TBTDET), t-butylimino tri-(ethylmethylamino) tantalum (TBTEMT) and tantalum halides.

6. The method of claim 3, wherein the treating of the first barrier layer is performed by hydrogen reduction or by thermal hydrogen reduction or by exposure to a hydrogen-containing plasma.

7. The method of claim 6, wherein the hydrogen-containing plasma is generated in an inductively coupled plasma apparatus, a capacitively coupled plasma apparatus, or a downstream plasma processing apparatus.

8. The method of claim 3, wherein the second barrier layer is formed by atomic layer deposition (ALD), thermal ALD, plasma enhanced ALD, or hot filament ALD.

9. The method of claim 8, wherein the ALD is performed with a bis(cyclopentadienyl) ruthenium (RuCp2) or a bis (ethylcyclopentadienyl) ruthenium (Ru(CpEt)2) precursor.

10. The method of claim 3, wherein the treating of the second barrier layer to form the ruthenium oxide zone is performed by exposure to an oxygen-containing plasma.

11. The method of claim 3, wherein the treating of the ruthenium oxide zone to form the ruthenium-rich zone is performed by hydrogen reduction or by thermal hydrogen reduction or by exposure to a hydrogen-containing plasma.

12. The method of claim 3, wherein all coating and treating are performed in situ in separate chambers, while maintaining the semiconductor substrate in a vacuum environment.

13. The interconnect structure of claim 1, wherein the ruthenium-rich zone has a thickness ranging from about 5 Å to about 10 Å; and the ruthenium oxide zone has a thickness ranging from about 5 Å to about 15 Å.

14. An interconnect structure comprising:
a layer of dielectric material having at least one opening;
a tantalum- and nitrogen-containing first barrier layer on sidewalls defining the opening, the first barrier layer having a tantalum-rich zone and a tantalum nitride zone, wherein the nitrogen content of the tantalum nitride zone is greater than the nitrogen content of the tantalum-rich zone, the tantalum nitride zone being interposed between the dielectric material and the tantalum-rich zone;
a ruthenium- and oxygen-containing second barrier layer overlaying the first barrier layer, the second barrier layer having a ruthenium zone which consists of ruthenium, a ruthenium oxide zone, and a ruthenium-rich zone, the ruthenium zone being interposed between the tantalum-rich zone and the ruthenium oxide zone, and the ruthenium oxide zone being interposed between the ruthenium zone and the ruthenium-rich zone; and
a seed layer over the second barrier layer and a bulk metal filling the entire opening, wherein the seed layer and bulk metal are composed of copper or a copper alloy.

15. The interconnect structure of claim 14, wherein:
(i) the opening is a trench, contact or via; and/or
(ii) the dielectric material is a low-k dielectric or a higher-k dielectric.

16. The interconnect structure of claim 15, wherein the low-k dielectric material is an organosilicate glass (OSG), a fluorinated silica glass (FSG), a carbon-doped oxide, a mesoporous glass, or an organic polymer.

17. The interconnect structure of claim 15, wherein the higher-k dielectric material is borophosphosilicate glass (BPSG) or tetraethylorthosilicate (TEOS).

18. The interconnect structure of claim 15, wherein:
(i) the ruthenium-rich zone consists of ruthenium;
(ii) the first barrier layer has a thickness ranging from about 20 Å to about 40 Å;
(iii) the tantalum-rich zone has a thickness ranging from about 5 Å to about 15 Å;
(iv) the second barrier layer has a thickness ranging from about 20 Å to about 40 Å;
(v) the ruthenium oxide zone has a thickness ranging from about 5 Å to about 15 Å;
(vi) the ruthenium-rich zone has a thickness of about a monolayer or a thickness ranging from about 5 Å to about 10 Å; and/or
(vii) the structure is a dual damascene structure.

* * * * *